United States Patent [19]
Wang et al.

[11] Patent Number: 5,641,710
[45] Date of Patent: Jun. 24, 1997

[54] POST TUNGSTEN ETCH BACK ANNEAL, TO IMPROVE ALUMINUM STEP COVERAGE

[75] Inventors: Jyh-Haur Wang; Shun-Liang Hsu, both of Hsin-Chu, Taiwan

[73] Assignee: Taiwan Semiconductor Manufacturing Company, Ltd., Hsin-Chu, Taiwan

[21] Appl. No.: 661,243

[22] Filed: Jun. 10, 1996

[51] Int. Cl.⁶ .................................................. H01L 21/28
[52] U.S. Cl. ......................... 438/643; 438/644; 438/629
[58] Field of Search ......................................... 437/190, 192, 437/194, 228, 246

[56] References Cited

U.S. PATENT DOCUMENTS

| | | | |
|---|---|---|---|
| 5,407,861 | 4/1995 | Marangon et al. | 437/192 |
| 5,420,072 | 5/1995 | Fiordalice et al. | 437/192 |
| 5,422,310 | 6/1995 | Ito | 437/192 |
| 5,521,121 | 5/1996 | Tsai et al. | 437/190 |
| 5,554,563 | 9/1996 | Chu et al. | 437/190 |

FOREIGN PATENT DOCUMENTS

| | | |
|---|---|---|
| 596364 | 5/1994 | European Pat. Off. |
| 1-189138 | 7/1989 | Japan |

*Primary Examiner*—John Niebling
*Assistant Examiner*—Thomas G. Bilodeau
*Attorney, Agent, or Firm*—George O. Saile

[57] ABSTRACT

A process has been developed in which an aluminum based, interconnect structure overlies a tungsten plug structure, in a small diameter contact hole. The tungsten plug is formed via RIE removal of unwanted tungsten, from areas other then the contact hole using a halogen containing etchant, and using a RIE overetch cycle that created an unwanted crevice in the center of the tungsten plug. A post RIE anneal, in a nitrogen ambient removes moisture from surrounding dielectric layers and also forms a protective, nitrogen containing tungsten layer, filling the crevice in the tungsten plug. The filling of the crevice allows a planar overlying aluminum based, interconnect structure to be obtained.

22 Claims, 3 Drawing Sheets

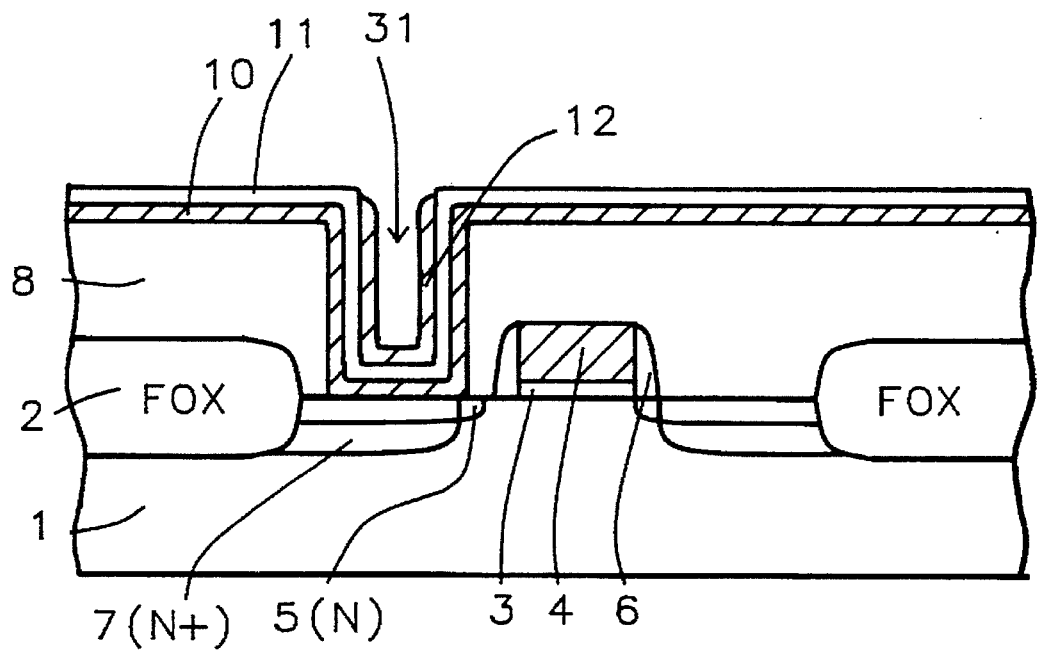
FIG. 3
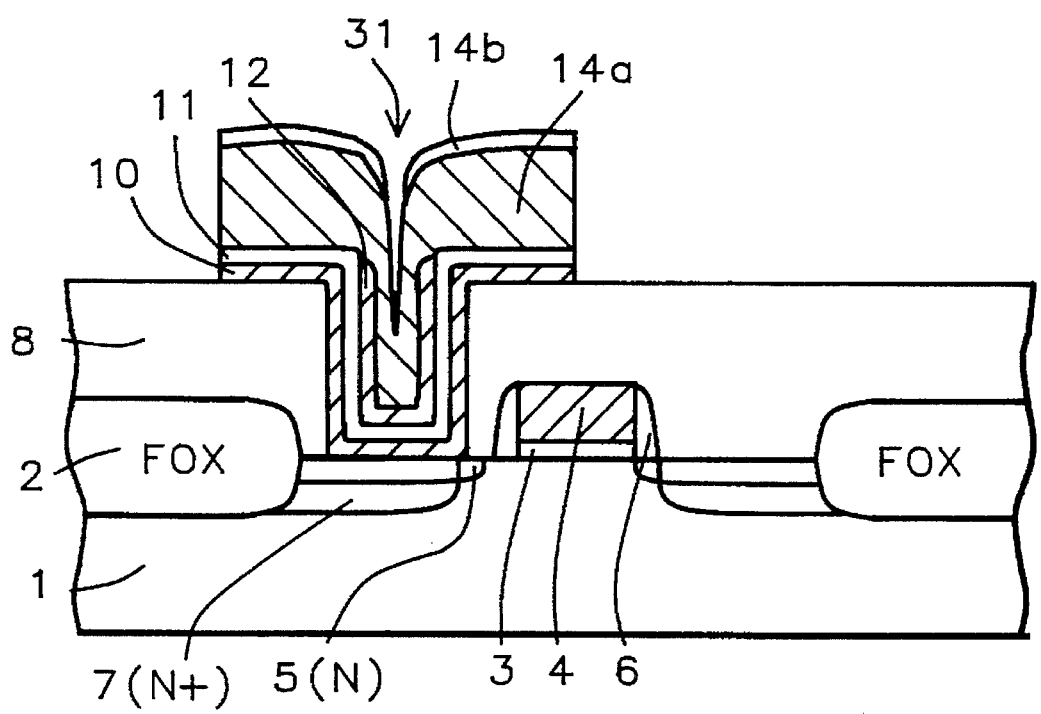
FIG. 4 - Prior Art

5,641,710

1

POST TUNGSTEN ETCH BACK ANNEAL, TO IMPROVE ALUMINUM STEP COVERAGE

BACKGROUND OF THE INVENTION (1) Field of The Invention

The present invention relates to the fabrication methods used to produce semiconductor devices, and more specifically to methods used to produce interconnect metallization structures.

(2) Description of Prior Art

The semiconductor industry is continually striving to produce higher performing silicon devices, while also attempting to reduce the cost of fabricating these higher performing devices. The ability to fabricate silicon chips, with sub-micron features, has allowed the performance and cost objectives, in part, to be realized. The trend to micro-miniaturization, or the use of smaller silicon device features, has resulted in significant decreases in performance degrading resistances and capacitances, thus allowing faster silicon chips to be produced. In addition the use of sub-micron features allows a greater amount of smaller silicon chips to be obtained from a specific size starting substrate, thus ultimately reducing the manufacturing cost of the chip. Micro-miniaturazation has been accomplished by advances in many semiconductor fabrication disciplines, including photolithography and reactive ion etching, (RIE). The use of more sophisticated exposure cameras, as well as the use of more sensitive photoresist materials, have allowed sub-micron images to be routinely produced in photoresist materials. In addition similar advances in dry etching apparatus and procedures have allowed the sub-micron images in photoresist, to be successfully transferred to underlying materials used for the fabrication of silicon chips.

However the use of silicon devices, with sub-micron features, can result in yield and reliability problems, not encountered with counterparts fabricated using less aggressive dimensions. For example in order to increase silicon device density, contact holes, used to connect an overlying interconnect metallization layer to an underlying device region, are fabricated with widths or diameters smaller then 0.5 um. The sub-micron, contact hole openings make it difficult to use aluminum based metallizations as a contact hole fill material. First it is difficult to chemically vapor deposit aluminum, and the use of sputtered aluminum deposition does not result in the desired conformality needed to adequately fill the contact hole with sub-micron openings. In addition the increased current densities encountered with aluminum filled, sub-micron contact holes, could present reliability problems in terms of electromigration. Therefore the industry has used low pressure chemical vapor deposited, (LPCVD), tungsten, as a fill material for narrow diameter contact holes. The more conformal LPCVD process, and the ability of tungsten to withstand high current densities, has made tungsten the material most used, by the semiconductor industry, when filling contact holes with narrow openings.

The formation of tungsten filled contact holes, used to connect underlying active device regions, in a semiconductor substrate, to an overlying interconnect metallization structure, is usually accomplished by initially depositing LPCVD tungsten, followed by removal of the unwanted tungsten, from regions outside the contact hole. The LPCVD deposition can result in a seam in the tungsten fill, or tungsten plug, in the small diameter contact hole. The seam is a result of an LPCVD process which fills the contact hole by deposition on the sides of the hole. The convergence of

2 the tungsten layers, leads to a seam in the center of the tungsten plug. The removal of the unwanted tungsten is, in turn, usually accomplished by selective, reactive ion etching, (RIE), procedures. Selectivity is needed to prevent underlying materials, tiatnium and titanium nitride in this case, from being etched at the completion of the tungsten removal cycle. The desired selectivity is achieved using a halogen containing compound for the RIE processing of tungsten. For example, $SF_6$, or a $Cl_2$ containing etchant, results in a large removal rate for tungsten layers, while not significantly attacking the underlying titanium and titanium nitride layers, at the conclusion of the tungsten etch cycle. The extensive RIE processing can result in larger opening in the crevice, in the tungsten fill, to be exposed, greater in width then the opening in the crevice, at the top of the tungsten fill. The larger crevice in the tungsten plug does not allow adequate coverage of overlying interconnect metallizations, and overlying anti-reflective coatings, (ARC), to occur in regions where these layers, usually aluminum and titanium nitride, overlie the crevice in the tungsten plug. If the ARC layer is too thin, or missing in specific regions, aluminum interconnect metallization can be attacked, or eroded in these areas, by a corrosion mechanism. The cavity created by the inability of aluminum to adequately cover the crevice in the tungsten plug, can be a reservoir for moisture, introduced from surrounding non-dense interlevel dielectric layers. The moisture—rich cavity, in turn, can trap halogens, basically chlorine found in the atmosphere, and the combination of moisture and chlorine can result in attack, or corrosion, of aluminum, exposed due to the absence of a protective ARC layer.

Several methods for forming tungsten plugs have been disclosed, such as Ito, et al. in U.S. Pat. No. 5,422,310, Fiordalice, in U.S. Pat. No. 5,420,072, and Marangon, et al. in U.S. Pat. No. 5,407,861. However these inventions do not address the embedded halogens encountered at end point of the etch back process, and the subsequent aluminum corrosion mechanism. This invention will teach a process in which the attack of aluminum, in a cavity created by the underlying tungsten plug definition, is prevented by an anneal step performed in a nitrogen ambient. This anneal process, performed after the tungsten plug etch back procedure, allows a nitrogen containing tungsten layer, to form on the exposed surface of the tungsten crevice, filling the crevice and thus allowing for better coverage of the overlying aluminum and ARC layers to occur. The anneal also allows moisture from the non-dense interlevel dielectric layer, to be removed.

SUMMARY OF THE INVENTION

It is an object of this invention to provide a process for fabricating tungsten filled, small diameter contact holes, to be used to connect active silicon device regions, in an underlying semiconductor substrate, to an overlying metallization.

It is another object of this invention to initially fill the small diameter contact hole with chemically vapor deposited tungsten.

It is yet another object of this invention to form a tungsten plug in the small diameter contact hole by removing tungsten, from regions outside the small diameter contact hole, using reactive ion etching procedures, using a halogen containing etchant.

It is still yet another object of this invention to perform a heat cycle, in a nitrogen ambient, to remove moisture from surrounding, non-dense dielectric layers, and to create a nitrogen containing layer, on the top surface of the tungsten plug, allowing for improved coverage for overlying interconnect metallization layers, to occur.

In accordance with the present invention a process is described for creating aluminum based, interconnect metallization structures, overlying a tungsten filled contact hole, with the improved step coverage of the aluminum interconnect metallization, in regions where overlying poor tungsten topography. A contact hole is opened in a dielectric layer, to an active device region in a semiconductor substrate. A layer of titanium, to be used for adhesion and contact purposes, and a layer of titanium nitride, to be used as a barrier layer to protect underlying materials from subsequent process reactants, are deposited. Chemical vapor deposition of tungsten is next performed to fill the small diameter contact hole, followed by an etch back procedure, via use of a halogen containing etchant, used to remove unwanted tungsten from all areas except from the tungsten filled contact hole, creating a tungsten plug. A nitrogen anneal cycle is employed to remove moisture from surrounding, non-dense, dielectric layers, and to form a nitrogen containing layer on the exposed surfaces of the underlying tungsten plug. An aluminum based metallization layer, and a titanium nitride, anti-reflective coating, are next deposited, and patterned, resulting in improved step coverage, in regions overlying the tungsten plug, due to the nitrogen containing, tungsten layer, filling the crevice in the underlying tungsten plug.

BRIEF DESCRIPTION OF THE DRAWINGS

The object and other advantages of this invention are best described in the preferred embodiment with reference to the attached drawings that include:

FIG. 3, which schematically, in cross-sectional style, shows the crevice created in the tungsten plug structure, as a result of tungsten etch back process.

FIG. 4, which schematically shows prior art, and the poor step coverage, and subsequent erosion of an aluminum interconnect structure, overlying the crevice in the tungsten plug structure.

DESCRIPTION OF THE PREFERRED EMBODIMENTS

The method of creating a good step coverage of an overlying aluminum interconnect structure, and an underlying tungsten plug structure, will now be described. This invention can be used as part of metal oxide semiconductor field effect transistors, (MOSFET), devices, that are currently being manufactured in industry, therefore only the specific areas, unique to understanding this invention, will be covered in detail.

Figure 1:
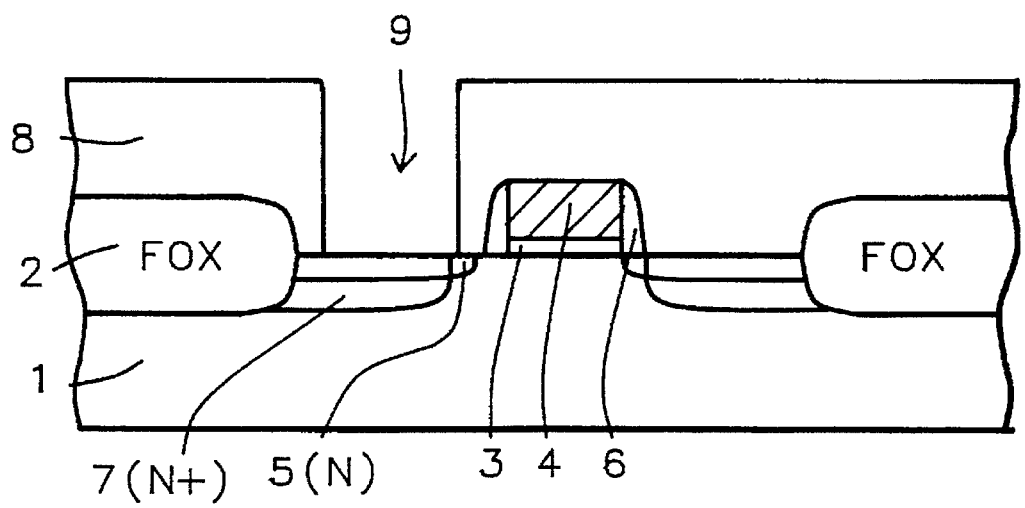
FIG. 1, which schematically, in cross-sectional style, shows a silicon device, at a stage prior to filling a small diameter contact hole with tungsten.

A typical N channel, (NFET), device, with small diameter contact holes, is schematically shown in FIG. 1. A substrate, 1, composed of P type, single crystalline silicon, with a <100> crystallographic orientation, is used. Thick field oxide regions, 2, (FOX), are formed for isolation purposes. The FOX regions are formed by patterning a composite insulator, oxidation mask, composed of an overlying silicon nitride layer, and an underlying silicon dioxide layer. Patterning is accomplished via conventional photolithographic and reactive ion etching, (RIE), procedures. After photoresist removal, performed via plasma oxygen ashing, followed by careful wet cleans, a thick FOX insulator is grown in the silicon regions not covered with the composite insulator oxidation mask. The FOX insulator is obtained via thermal oxidation in an oxygen—steam ambient, at a temperature between about 850° to 1050° C., grown to a thickness between about 4000 to 6000 Angstroms. After removal of the insulator composite oxidation mask, using hot phosphoric acid for the silicon nitride layer, and a buffered hydrofluoric acid solution for the underlying silicon dioxide layer, a thin silicon dioxide, gate insulator, 3, is grown in an oxygen steam ambient, at a temperature between about 800° to 1000° C., to a thickness between about 50 to 300 Angstroms. A polysilicon layer is next deposited using low pressure chemical vapor deposition, (LPCVD), processing, at a temperature between about 500° to 700° C., to a thickness between about 1500 to 4000 Angstroms. The polysilicon can be grown using insitu doping techniques via the addition of either phosphine or arsine, to a silane ambient. The polysilicon can also be deposited intrinsically and doped via ion implantation of either phosphorous or arsenic, at an energy between about 50 to 100 Kev., at a dose between about 1E15 to 1E16 atoms/c$^2$. Conventional photolithographic and RIE procedures, using $Cl_2$ as an etchant, are used to create polysilicon gate structure, 4, shown schematically in FIG. 1.

After photoresist removal, via use of plasma oxygen ashing and careful wet cleans, an N type, lightly doped source and drain region, 5, is formed via use of an ion implantation procedure, using phosphorous at an energy between about 30 to 60 Kev., at a dose between about 1E12 to 5E13 atoms/cm$^2$. A silicon oxide layer is next deposited using either LPCVD or plasma enhanced chemical vapor deposition, (PECVD), procedures, at a temperature between about 400° to 800° C., to a thickness between about 1500 to 4000 Angstroms, using tetraethylorthosilicate as a source. An anisotropic, RIE procedure, using $CHF_3$ as an etchant, is used to create insulator sidewall spacer, 6, shown schematically in FIG. 1. Another ion implantation process, using arsenic at an energy between about 50 to 100 Kev., and at a dose between about 1E14 to 5E15 atoms/cm$^2$, is used to create the heavily doped source and drain region, 7.

Another silicon oxide layer, 8, is deposited using either LPCVD, PECVD, or atmospheric pressure chemical vapor deposition, (APCVD), processing, at a temperature between about 400° to 800° C., to a thickness between about 5000 to 10000 Angstroms, and planarized using conventional chemical mechanical polishing procedures. Photolithographic and RIE procedures, using $CHF_3$ and $CF_4$ as etchants, are then used to open contact hole, 9, exposing heavily doped source and drain region, 7. More aggressive designs, employing sub-micron features, results in contact holes exhibiting high aspect ratios, that is the depth of the contact hole, divided by the width of the contact hole opening. The size of the opening for contact hole, 9, is between about 0.3 to 0.5 um, in diameter, resulting in high aspect ratios between about 1 to 3, making it more difficult to fill with conventional metallization deposition processes, such as sputtering or evaporation, then larger contact hole counterparts. Therefore the use of tungsten, obtained via LPCVD procedures, for the contact hole filling, will subsequently be used. FIG. 1, schematically depicts this structure after photoresist removal, accomplished via plasma oxygen ashing, followed by careful wet cleans.

Figure 2:
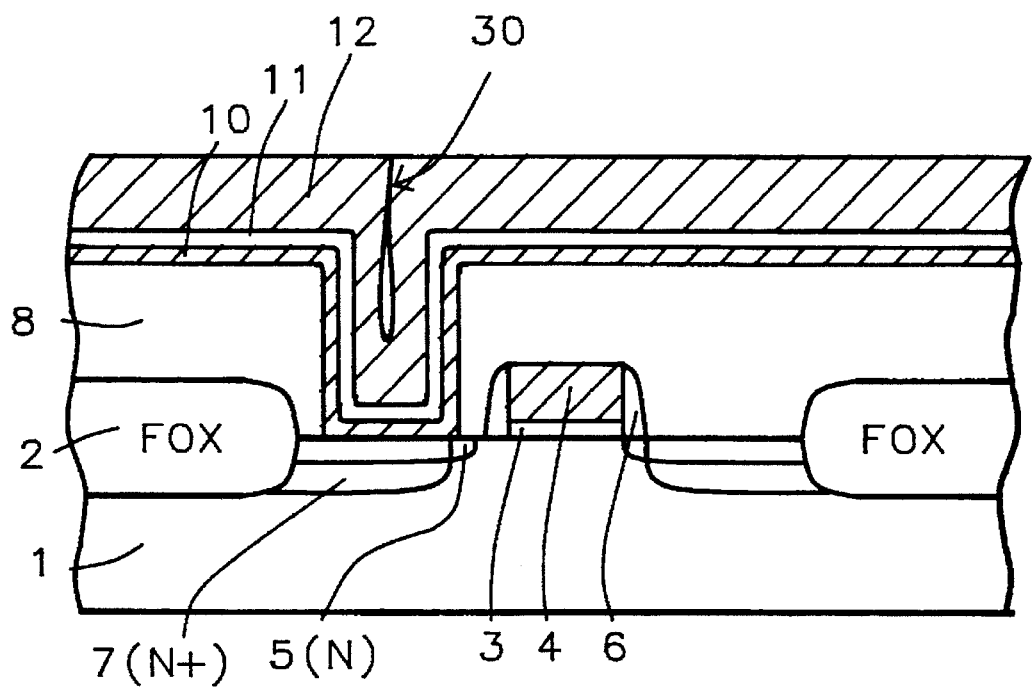
FIG. 2, which schematically, in cross-sectional style, shows the filling of a small diameter contact hole with tungsten.
Figure 5:
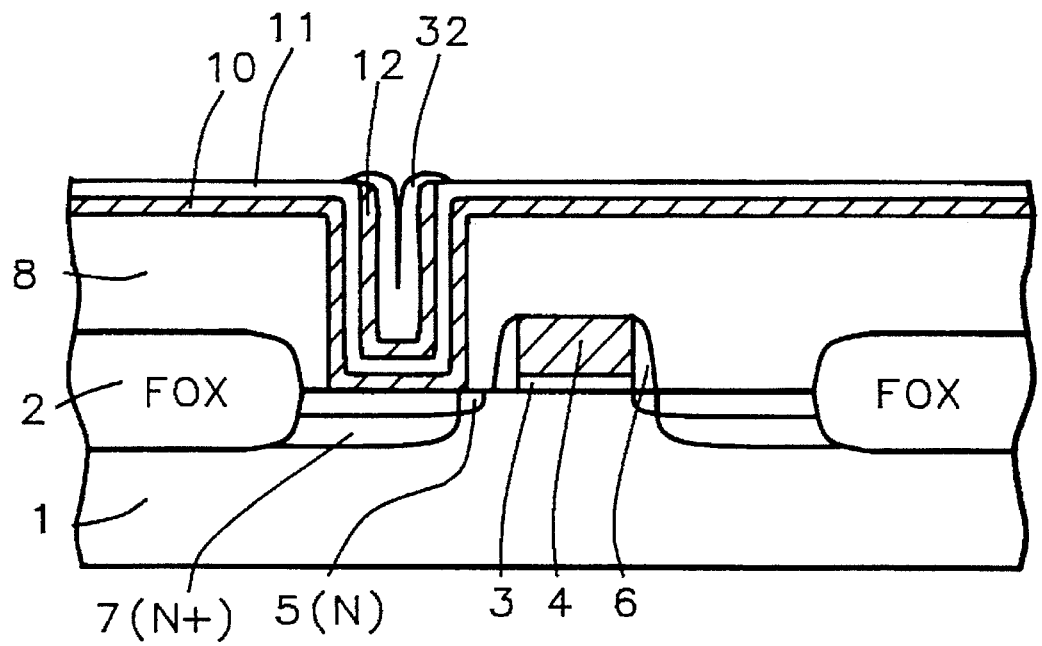
FIG. 5, which schematically, in cross-sectional style, shows a the formation of a nitrogen containing layer, on the exposed surfaces of the tungsten plug, of a post etch back anneal process.

A buffered hydrofluoric acid pre-clean is next used to remove native oxides from the surface of heavily doped source and region, 7, at the bottom of the contact hole, 9. A layer of titanium, 10, shown in FIG. 2, is deposited using r.f. sputtering, to a thickness between about 200 to 500 Angstroms. The titanium layer, 10, is used to optimize the contact resistance of subsequent overlying materials, to underlying source and drain region, 7. In addition titanium layer, 10, provides excellent adhesion to the silicon oxide sidewalls, of contact hole, 9. Next a layer of titanium nitride, 11, is deposited, again via the use of r.f. sputtering, to a thickness between about 500 to 1000 Angstroms. The titanium nitride layer serves as a barrier to protect underlying materials, such as titanium layer, 10, as well as source and drain region, 7, from the deleterious effects of by-products produced during subsequent processing. The decomposition of tungsten hexafluoride, used as a source for LPCVD tungsten, produces fluorine containing by-products that can react with titanium or silicon, if not protected. Tungsten layer, 12, is next deposited using LPCVD processing, at a temperature between about 400° to 500° C., using tungsten hexafluoride and silane, to a thickness between about 6000 to 8000 Angstroms. This is schematically shown in FIG. 2. A seam, 30, shown schematically in FIG. 2, is formed as a result of tungsten deposition on the sides of contact hole, 9, with the depositing layers converging near the center of the contact hole, however forming seam, 30, as a result of a lack of perfect convergence of the depositing tungsten layers.

FIG. 3 shows the result of a blanket, selective, RIE etch back process, using $SF_6$ as an etchant, used to create a tungsten plug in the high aspect ratio contact hole, by removal of unwanted tungsten from all regions, outside of the contact hole. The etch back, using $SF_6$, or an alternative etchant containing $Cl_2$, and an over etch cycle, used to insure complete removal of tungsten, even in areas of poor uniformity, where thicker tungsten layers may have existed, results in an aggravation of seam 30, enlarging to crevice, 31, shown schematically in FIG. 3.

The consequence of the crevice, 31, halogen is described with the prior art, shown in FIG. 4. The next processing sequence is the r.f. sputtered deposition of an aluminum based layer, 14a, and titanium nitride, anti-reflective coating, (ARC), 14b, deposited to a thickness between about 4000 to 10000, and between about 500 to 1000 Angstroms, respectfully. The inability of aluminum based layer, 14a, to effectively cover crevice, 31, results in thin, or missing ARC layer, 14b, in the region of crevice, 31. This in turn allows moisture from insulator layer, 8, and chlorine from the atmosphere, to react with the unprotected, thin aluminum based layer, 14a, in the region overlying crevice, 31. This mechanism, basically a function of poor aluminum coverage, and moisture from surrounding layers, result in deleterious attack of the aluminum interconnect, resulting in either electrical opens, or high resistance interconnects.

Figure 6:
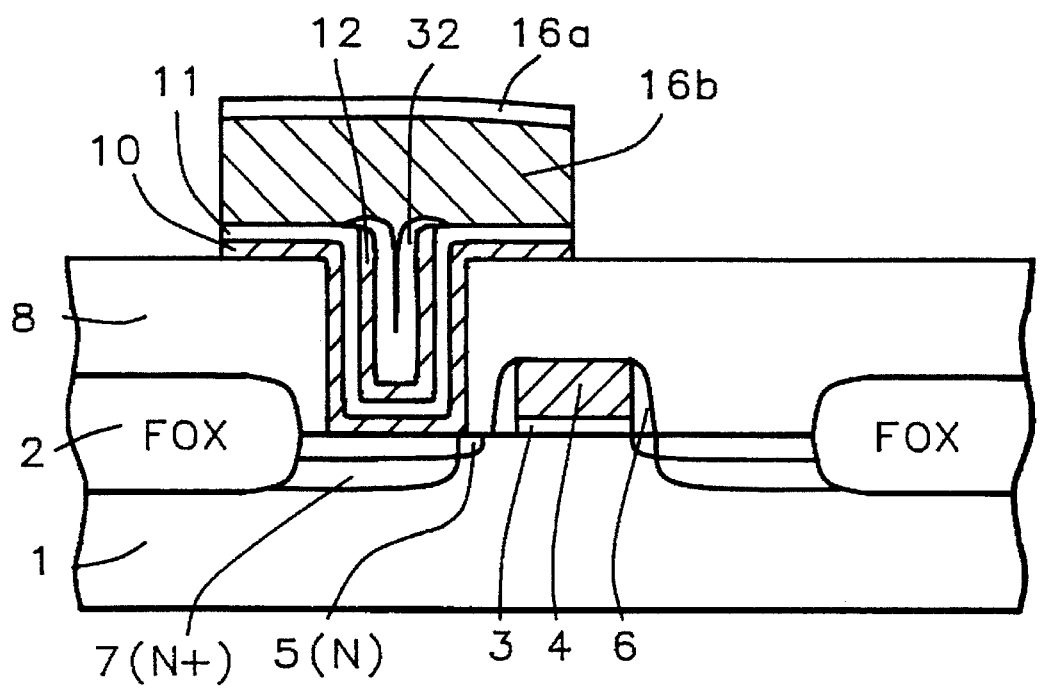
FIG. 6, which schematically, in cross-sectional style, represents a corrosion free interface, and improved metallization coverage, between an overlying aluminum interconnect structure, and an underlying tungsten plug structure, resulting from the formation of the nitrogen containing layer, formed from the post etch back anneal.

A process designed to remove moisture from surrounding insulator layers, while allowing improved aluminum coverage, on underlying tungsten plugs, thus resulting in composite structures, exhibiting an absence of aluminum attack, eliminating electrical opens and high wiring resistances, will now be described. Referring back to FIG. 3, the removal of tungsten, via a halogen containing RIE etchant, resulted in the formation of crevice, 31. However this structure, with crevice, 31, is subjected to an anneal in an inert ambient at a temperature between about 450° to 530° C., with a temperature of 490° C. being preferred, and for a time between about 15 to 45 min. The anneal ambient, preferably 100% nitrogen, at a flow between about 0.5 to 5 standard liters per min., of nitrogen, allows moisture from insulator layer, 8, to be removed. In addition this anneal forms a nitrogen containing, tungsten layer, 32, on the exposed surface of tungsten structure, 12, filling crevice, 31, and subsequently allowing overlying metallizations to more adequately cover tungsten plug, 12. Subsequent deposition of an aluminum based layer, 16a, containing between about 1.0 to 3.0% copper, and between about 0.5 to 2.0% silicon, deposited using r.f. sputtering, at a temperature between about 100° to 400° C., to a thickness between about 4000 to 10000 Angstroms, and an overlying titanium nitride, (ARC), layer, 16b, also obtained via r.f. sputtering, to a thickness between about 500 to 1000 Angstroms, is performed. ARC layer, 16b, is now continuous, due to the improved topography, resulting from the nitrogen containing tungsten layer, 32, filling crevice, 31, thus offering protection to the underlying aluminum based layer, 16a, from chlorine reactants, in the atmosphere. Standard photolithographic and reactive ion etching procedures, using $Cl_2$ as an etchant, to pattern titanium nitride layer, 16b, aluminum based layer, 16a, titanium nitride layer, 11, and titanium layer, 10, result in aluminum based interconnect structure, 16c, shown schematically in FIG. 6. The interconnect structure, composed of titanium nitride layer, 16b, and aluminum based layer, 16a, is now able to easily cover the underlying tungsten plug, 12, due to the planarity obtained via the nitrogen containing tungsten layer, 32. In addition the anneal procedure used to create nitrogen containing tungsten layer, 32, resulted in removal of moisture from insulator layer, 8, thus removing a component of the reaction mixture, moisture and chlorine, needed to attack exposed aluminum based layer, 16a.

This process, although shown for tungsten filled contact holes, used to connect overlying interconnect metallization structures, to underlying active silicon device regions, can also be applied to tungsten filled via holes, used to connect two levels of interconnect metallization layers. In addition this process, although shown as an application for an N channel, (NFET), device, can also be applied to P channel, (PFET), devices, to complimentary, (CMOS), devices, as well as to BiCMOS devices.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a MOSFET device structure, on a semiconductor substrate, using a metal filled contact hole, to provide electrical contact to an underlying conductive region, on a semiconductor substrate, and also to provide a electrical contact to an overlying interconnect metallization structure, comprising the steps of:

providing said underlying conductive region, on said semiconductor substrate;

deposition of a dielectric layer on said semiconductor substrate, including deposition on said underlying conductive region;

photolithographic processing to open a region in a photoresist layer, exposing said dielectric layer, directly overlying a specific area of said underlying conductive region;

anisotropic etching of said dielectric layer, in opened region of said photoresist layer, to create a contact hole in said dielectric layer, to said specific area of said underlying conductive region;

removal of said photoresist layer;

surface cleaning of said specific area, of said underlying conductive region;

deposition of an adhesive layer on top surface of said dielectric layer, on sides of said contact hole, and on said specific area, of said underlying conductive layer;

deposition of a first barrier layer on said adhesive layer;

deposition of a metal fill layer, on said first barrier layer, filling said contact hole;

anisotropic dry etching to remove said metal fill layer, from top surface of said barrier layer, forming a metal plug structure, in said contact hole;

annealing of said MOSFET device structure at a temperature greater than 450° C. and less than about 530° C., in an inert ambient, to remove moisture from said dielectric layer, and forming a protective layer on exposed surfaces of said metal plug structure;

deposition of an interconnect metallization layer on said protective layer, overlying said metal plug structure, in said contact hole, and on said top surface of said first barrier layer;

deposition of a second barrier layer on said interconnect metallization layer; and patterning of said second barrier layer, of said interconnect metallization layer, of said first barrier layer, and of said adhesive layer, to form said metal interconnect structure.

2. The method of claim 1, wherein said underlying conductive region, on said semiconductor substrate, is an N type, doped source and drain region, of a MOSFET device.

3. The method of claim 1, wherein said dielectric layer is silicon oxide, deposited using either LPCVD, PECVD, or APCVD processing, at a temperature between about 400° to 800° C., to a thickness between about 5000 to 10000 Angstroms.

4. The method of claim 1, wherein said contact hole is formed via anisotropic, RIE processing, using $CHF_3$ as an etchant, with said contact hole having an opening between about 0.3 to 0.5 um, in diameter, resulting in an aspect ratio of between about 1 to 3.

5. The method of claim 1, wherein said adhesive layer is titanium, deposited using r.f. sputtering, to a thickness between about 200 to 500 Angstroms.

6. The method of claim 1, wherein said first barrier layer is titanium nitride, deposited using r.f. sputtering, to a thickness between about 500 to 1000 Angstroms.

7. The method of claim 1, wherein said first metal layer is tungsten, deposited using LPCVD processing, at a temperature between about 400° to 500° C., to a thickness between about 6000 to 8000 Angstroms, using tungsten hexafluoride and silane.

8. The method of claim 1, wherein removal of said metal fill layer, from surface of said barrier layer, forming said first metal plug, in said contact hole, is performed using RIE processing, using a halogen containing etchant.

9. The method of claim 1, wherein annealing of said MOSFET device structure is performed, for a time between about 15 to 45 min., using a flow between about 0.5 to 5.0 standard liters per min. of 100% nitrogen, forming a nitrogen containing, said protective layer, on the exposed surface of said metal plug.

10. The method of claim 1, wherein said interconnect metallization layer is aluminum, containing between about 1.0 to 3.0% copper, and between about 0.5 to 2.0% silicon, deposited using r.f. sputtering, at a temperature between about 100° to 400° C., to a thickness between about 4000 to 10000 Angstroms.

11. The method of claim 1, wherein said second barrier layer is titanium nitride, deposited using r.f. sputtering, to a thickness between about 500 to 1000 Angstroms.

12. A method for fabricating a MOSFET device structure, on a semiconductor substrate, using a tungsten plug, to fill a contact hole, that will provide electrical contact between an active silicon device region, in a semiconductor substrate, and also to provide an electrical contact to an overlying aluminum based interconnect metallization structure, comprising the steps of:

providing said active silicon device region, in said semiconductor substrate;

deposition of a dielectric layer on said semiconductor substrate, including deposition on said active silicon device region;

photolithographic processing to open a small diameter region in a photoresist layer where the small diameter is between about 0.3 and 0.5 µm exposing said dielectric layer, directly overlying said active silicon device region;

anisotropic etching of said dielectric layer, in said small diameter region, opened in said photoresist layer, to create a small diameter contact hole in said dielectric layer, to said active silicon device region;

removal of said photoresist layer;

surface cleaning of said active silicon device region;

deposition of a titanium layer on top surface of said dielectric layer, on sides of said small diameter contact hole, and on active silicon device region;

deposition of a first titanium nitride layer on said titanium layer;

deposition of a tungsten layer, on said first titanium nitride layer, filling said small diameter contact hole;

anisotropic dry etching to remove said tungsten layer from top surface of said first titanium nitride layer, using a halogen containing dry etchant, forming a tungsten plug structure in said small diameter contact hole;

annealing of said MOSFET device structure, in an nitrogen ambient at a temperature greater that 450° C. and less than about 530° C., to remove moisture halogen from said dielectric layer, and forming a nitrogen containing protective layer, on the exposed surfaces of said tungsten plug structure;

deposition of an aluminum based, metallization layer on said nitrogen containing, protective layer, overlying said tungsten plug structure, in said small diameter contact hole, and on the top surface of said first titanium nitride layer;

deposition of a second titanium nitride layer on said aluminum based, metallization layer; and patterning of said second titanium nitride layer, of said aluminum based, interconnect metallization layer, of said first titanium nitride layer, and of said titanium layer, to form said metal interconnect structure.

13. The method of claim 12, wherein said active silicon device region, in said semiconductor substrate, is an N type, doped source and drain region.

14. The method of claim 12, wherein said dielectric layer is silicon oxide, deposited using either LPCVD, PECVD, or APCVD processing, at a temperature between about 400° to 800° C., to a thickness between about 5000 to 10000 Angstroms.

15. The method of claim 12, wherein said small diameter contact hole is formed via anisotropic, RIE processing, using $CHF_3$ as an etchant, in diameter, and resulting in an aspect ratio between about 1 to 3.

16. The method of claim 12, wherein said titanium layer is deposited using r.f. sputtering, to a thickness between about 200 to 500 Angstroms.

17. The method of claim 12, wherein said first titanium nitride layer is deposited via r.f. sputtering, to a thickness between about 500 to 1000 Angstroms.

18. The method of claim 12, wherein said tungsten layer is deposited using LPCVD processing, at a temperature between about 400° to 500° C., to a thickness between about 6000 to 8000 Angstroms, using tungsten hexafluoride and silane.

19. The method of claim 12, wherein removal of said first tungsten layer, from top surface of said first titanium nitride layer, forming said tungsten plug in small diameter contact hole, is performed using RIE processing, using a halogen containing etchant.

20. The method of claim 12, wherein annealing of said MOSFET device structure is performed at a flow between about 0.5 to 5.0 standard liters per min., of 100% nitrogen, for a time between about 15 to 45 min., to remove moisture from said dielectric layer, and to form the nitrogen containing, protective layer, on exposed surfaces of said tungsten plug structure.

21. The method of claim 12, wherein said second titanium nitride layer is deposited using r.f. sputtering, to a thickness between about 500 to 1000 Angstroms.

22. The method of claim 12, wherein said aluminum based, interconnect metallization layer is aluminum, containing between about 1.0 to 3.0% copper, and between about 0.5 to 2.0% silicon, deposited using r.f. sputtering, at a temperature between about 100° to 400° C., to a thickness between about 4000 to 8000 Angstroms.

* * * * *